US006849139B2

(12) United States Patent
Kardokus et al.

(10) Patent No.: US 6,849,139 B2
(45) Date of Patent: Feb. 1, 2005

(54) METHODS OF FORMING COPPER-CONTAINING SPUTTERING TARGETS

(75) Inventors: Janine K. Kardokus, Otis Orchards, WA (US); Chi tse Wu, Veradale, WA (US); Christopher L. Parfeniuk, Spokane, WA (US); Jane E. Buehler, Spokane, WA (US)

(73) Assignee: Honeywell International Inc., Morristown, NJ (US)

(*) Notice: Subject to any disclaimer, the term of this patent is extended or adjusted under 35 U.S.C. 154(b) by 186 days.

(21) Appl. No.: 10/027,992

(22) Filed: Dec. 19, 2001

(65) Prior Publication Data

US 2002/0112791 A1 Aug. 22, 2002

Related U.S. Application Data

(62) Division of application No. 09/714,714, filed on Nov. 15, 2000, which is a continuation of application No. 09/615,474, filed on Jul. 13, 2000, now Pat. No. 6,331,234, which is a continuation of application No. 09/324,299, filed on Jun. 2, 1999, now Pat. No. 6,113,761.

(51) Int. Cl.[7] ................................................. C21D 9/08
(52) U.S. Cl. ...................... 148/522; 148/554; 148/652
(58) Field of Search ............................... 148/522, 554; 428/652; 204/298.13, 298.12

(56) References Cited

U.S. PATENT DOCUMENTS

| 3,666,666 A | 5/1972 | Haertling |
| 3,766,642 A | 10/1973 | Schlaudt et al. |
| 3,923,675 A | 12/1975 | Mazdiyasni et al. |
| 3,963,934 A | 6/1976 | Ormrod |
| 4,132,614 A | 1/1979 | Cuomo et al. |
| 4,149,907 A | 4/1979 | Wronski et al. |
| 4,159,909 A | 7/1979 | Wilson |
| 4,189,084 A | 2/1980 | Johnson et al. |
| 4,198,283 A | 4/1980 | Class et al. |
| 4,209,375 A | 6/1980 | Gates et al. |
| 4,311,522 A * | 1/1982 | Batra et al. ................... 75/153 |
| 4,385,979 A | 5/1983 | Pierce et al. |
| 4,545,882 A | 10/1985 | McKelvey |
| 4,629,859 A | 12/1986 | Reddy |
| 4,676,827 A | 6/1987 | Hosoda et al. |
| 4,786,469 A | 11/1988 | Weber et al. |
| 4,814,053 A | 3/1989 | Shimokawato |
| 4,986,856 A | 1/1991 | Tanigawa et al. |

(List continued on next page.)

FOREIGN PATENT DOCUMENTS

| CN | 85104006 | 1/1986 |
| EP | 0335383 A2 | 10/1989 |
| EP | 0441408 A2 | 8/1991 |

(List continued on next page.)

OTHER PUBLICATIONS

Yeon et al., "Electrical Characteristics of the MOD–derived SrBi2xTa2O9 and SrBi2.4(TA,Nb)2O9 Thin Films", Journal of Materials Science, 35(10), pp. 2405–2411, May 15, 2000, Abstract only.

(List continued on next page.)

Primary Examiner—Scott Kastler
(74) Attorney, Agent, or Firm—Wells St. John P.S.

(57) ABSTRACT

The invention includes a method of forming a sputtering target containing copper of a purity of at least about 99.999 wt. %, and at least one component selected from the group consisting of Ag, Sn, Te, In, B, Bi, Sb, and P dispersed within the copper. The total of Ag, Sn, Te, In, B, Bi, Sb, and P within the copper is from at least 0.3 ppm to about 10 ppm. The sputtering target has a substantially uniform grain size of less than or equal to about 50 micrometers throughout the copper and the at least one component.

10 Claims, 8 Drawing Sheets

U.S. PATENT DOCUMENTS

| | | | |
|---|---|---|---|
| 5,023,698 A | 6/1991 | Kobayashi et al. | |
| 5,066,617 A | 11/1991 | Tanemoto et al. | |
| 5,077,005 A | 12/1991 | Kato | |
| 5,171,411 A | 12/1992 | Hillendahl et al. | |
| 5,215,639 A | 6/1993 | Boys | |
| 5,242,566 A | 9/1993 | Parker | |
| 5,268,236 A | 12/1993 | Dumont et al. | |
| 5,282,943 A | 2/1994 | Lannutti et al. | |
| 5,282,946 A | 2/1994 | Kinoshita et al. | |
| 5,312,790 A | 5/1994 | Sengupta et al. | |
| 5,314,651 A | 5/1994 | Kulwicki | |
| 5,336,386 A | 8/1994 | Marx et al. | |
| 5,397,050 A | 3/1995 | Mueller | |
| 5,435,826 A | 7/1995 | Sakakibara et al. | |
| 5,486,491 A | 1/1996 | Sengupta et al. | |
| 5,490,914 A | 2/1996 | Hurwitt et al. | |
| 5,589,040 A | 12/1996 | Nishimura | |
| 5,590,389 A | 12/1996 | Dunlop et al. | |
| 5,674,367 A | 10/1997 | Hunt et al. | |
| 5,693,203 A | 12/1997 | Ohhashi et al. | |
| 5,719,447 A | 2/1998 | Gardner | |
| 5,772,858 A | 6/1998 | Tepman | |
| 5,833,820 A | 11/1998 | Dubin | |
| 5,833,823 A | 11/1998 | Gruenenfelder et al. | |
| 5,846,389 A | 12/1998 | Levine et al. | |
| 5,895,562 A | 4/1999 | Dubin | |
| 5,972,192 A | 10/1999 | Dubin et al. | |
| 6,010,583 A | 1/2000 | Annavarapu et al. | |
| 6,028,003 A | 2/2000 | Frisa et al. | |
| 6,039,855 A | 3/2000 | Wollenberg | |
| 6,042,752 A | 3/2000 | Mitsui | |
| 6,068,742 A | 5/2000 | Daxinger et al. | |
| 6,086,735 A | 7/2000 | Gilman et al. | |
| 6,093,966 A | 7/2000 | Venkatraman et al. | |
| 6,113,761 A * | 9/2000 | Kardokus et al. | 204/298.13 |
| 6,117,281 A | 9/2000 | Novbakhtian | |
| 6,117,781 A | 9/2000 | Lukanc et al. | |
| 6,117,782 A | 9/2000 | Lukanc et al. | |
| 6,121,150 A | 9/2000 | Avanzino et al. | |
| 6,121,685 A | 9/2000 | Gardner | |
| 6,139,701 A * | 10/2000 | Pavate et al. | 204/298.13 |
| 6,162,726 A | 12/2000 | Dubin | |
| 6,197,433 B1 | 3/2001 | Hatano | |
| 6,238,494 B1 * | 5/2001 | Segal | 148/421 |
| 6,277,254 B1 | 8/2001 | Tan et al. | |
| 6,331,234 B1 * | 12/2001 | Kardokus et al. | 204/298.13 |
| 6,440,243 B1 | 8/2002 | Tan et al. | |
| 6,451,135 B1 | 9/2002 | Takahashi | |
| 6,451,222 B1 | 9/2002 | Li et al. | |
| 6,478,902 B2 | 11/2002 | Koenigsmann et al. | |
| 6,579,467 B2 | 6/2003 | Li et al. | |

FOREIGN PATENT DOCUMENTS

| | | | |
|---|---|---|---|
| EP | 0626722 A1 | | 11/1994 |
| EP | 0882813 A1 | * | 9/1998 |
| EP | 0882813 A1 | | 12/1998 |
| EP | 1026284 A1 | * | 9/2000 |
| EP | 00/73531 A2 | | 12/2000 |
| JP | 49007777 | | 1/1974 |
| JP | 61084389 | | 4/1986 |
| JP | 61113740 | | 5/1986 |
| JP | 61227972 | | 10/1986 |
| JP | 62036798 | | 2/1987 |
| JP | 62116743 | | 5/1987 |
| JP | 62127438 | | 6/1987 |
| JP | 01096376 | | 10/1987 |
| JP | 363033174 | | 2/1988 |
| JP | 63064211 | | 3/1988 |
| JP | 63118033 | | 5/1988 |
| JP | 63235442 | | 9/1988 |
| JP | 01096374 | | 4/1989 |
| JP | 02301585 | | 12/1990 |
| JP | 05078195 | | 3/1993 |
| JP | 06081138 | | 1/1994 |
| JP | 09249967 | | 9/1997 |
| JP | 10287939 | | 10/1998 |
| JP | 11323539 | | 11/1999 |
| JP | 2000239836 A | * | 9/2000 |

OTHER PUBLICATIONS

Yan et al., "Preparation on the [(Pb,La) (Zr,Ti)O3] Ferroelectric Thin Films by Using the Sol–Gel Processing", Piezoelectrics and Acoustooptics, vol. 17, issue n 5, Oct. 1995, pp. 24–27.

Physical Metallurgy Principles 2d ed., Dec. 1973, p. 298.

Phillips, V.A. et al., "The Effect of Certain Solute Elements on the Recrystallization of Copper", Journ. of Institute of Metals; vol. 81, 1952–53, pp. 185–208, (No Date).

Brizzolara et al., "Low Energy Sputtering of Eutectic Ag/Cu Alloys", Nuclear Instruments and Methods in Physics Research B26, Dec. 1987, pp. 528–531.

Cabral, C. et al., "Preparation of Low Resistivity Cu–1 at. %Cr Thin Films by Magnetron Sputtering", J. Vac. Sci. Technol. A 10(4), Jul./Aug. 1992, pp. 1706–1711.

Foster, N., "Composition and Structure of Sputtered Films of Ferroelectric Niobates", J. of Vac. Sci. and Tech., vol. 8, No. 1, (Dec. 1971), pp. 251–255.

Haerting, G., "Hot–Pressed Ferroelectric Lead Zirconate Titanate Ceramics for Electro–Optical Applications," Ceramic Bulletin, vol. 49, No. 6 (Dec. 1970), pp. 564–567.

Harper, J. et al., "Materials Issues in Copper Interconnections", MRS Bulletin, Aug. 1994, pp. 23–29.

Igarashi, Y. et al., "Electromigration Properties of Copper—Zirconium Alloy Interconnects", J. Vac. Sci. Technol. B 16(5), Sep./Oct. 1998, pp. 2745–2750.

Dierebusens et al., "Effect of Trace Elements On the Recrystallization Behavior of High Purity Oxygen–Containing Copper", Erzmetall, (Dec. 1975), 28(11), 496–500 (abstract only).

Massalski, T., "Binary Alloy Phase Diagrams", vol. 1, American Society for Metals, Ohio Dec. 1986, pp. 18–19, 928–929, 936–937, 964–965.

West, C., "International Critical Tables of Numerical Data, Physics, Chemistry and Technology", National Research Council of the USA, McGraw–Hill Book Co., Inc. Dec. 1933, 6 pages.

Pierson, K. et al., "Total Sputtering Yield of Ag/Cu Alloys for Low Energy Argon ions", Nucl. Instrum. Methods Phys. Res., Sect. B (Dec. 1996), vol. 108(2), pp. 290–299.

Rossnagel, S., "Direction and Preferential Sputtering–Based Physical Vapor Deposition", Thin Solid Films 263 (Dec. 1995), pp. 1–12.

Takewaki, T. et al., Excellent Electro/Stress—Migration–Resistance Surface–Silicide Passivated Giant–Grain Cu–Mg Alloy Interconnect Technology for Giga Scale Integrations (GSI), Dec. 1995 IEEE, pp. 10.5. – 110.5.4.

* cited by examiner

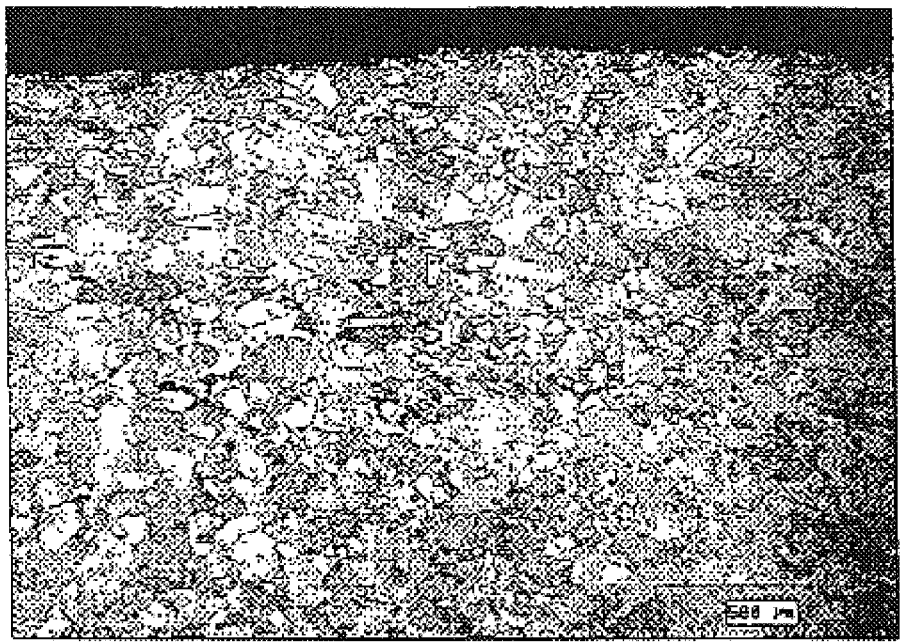
_Fig. 6_
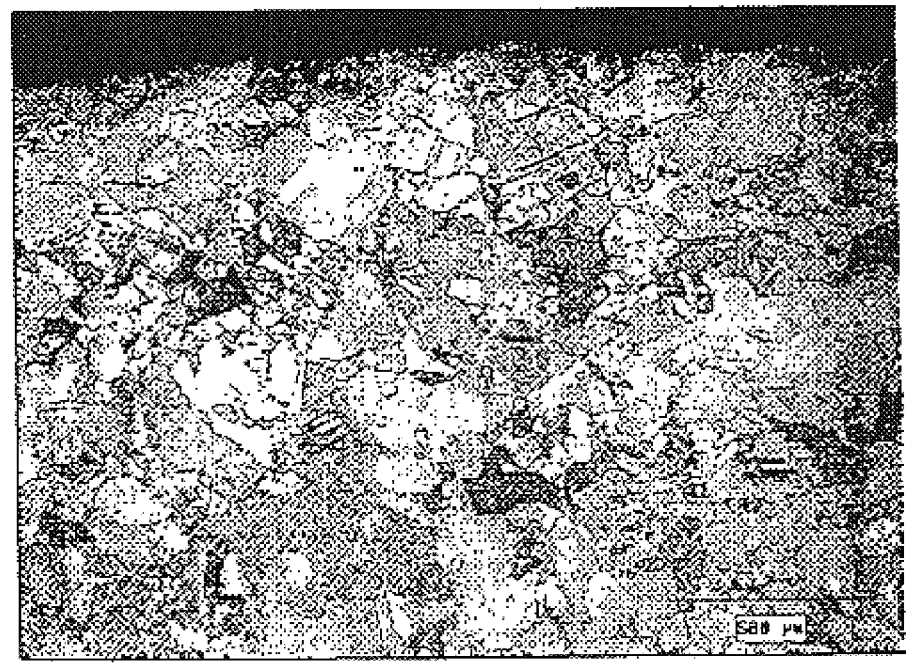
_Fig. 7_

200X

METHODS OF FORMING COPPER-CONTAINING SPUTTERING TARGETS

RELATED PATENT DATA

This patent resulted from a divisional application of U.S. patent application Ser. No. 09/714,714, filed on Nov. 15, 2000; which is a continuation application of U.S. patent application Ser. No. 09/615,474, filed on Jul. 13, 2000, now U.S. Pat. No. 6,331,234; which is a continuation application of U.S. patent application Ser. No. 09/324,299, filed on Jun. 2, 1999, and now U.S. Pat. No. 6,113,761.

BACKGROUND OF THE INVENTION

Interconnects for use in integrated circuits are generally made of aluminum but aluminum is unsatisfactory in high speed semiconductor devices. The resistivity of aluminum as well as its electromigration limits and restrict its use in such applications. The present invention contemplates use of high purity copper as interconnects for use in integrated circuits which have requirements of line width about 0.18 $\mu$m or less and are to be used in semiconductor devices at 1200 Mhz clock speeds. The interconnect lines are created by sputtering high purity copper from sputtering target assemblies.

To produce very small line widths, as described, we have determined that the sputtering target should be of high purity, i.e. at least 99.999 wt. % purity, (referred to as 5N copper) and preferably 99.9999 wt. % purity (referred to as 6N copper). Purity is important to maintain the low resistivity of the copper line so that high speed goals can be achieved. Moreover, purity may also influence electromigration resistance.

We have also determined that it is also desirable that the sputtering target have a fine and substantially uniform grain size, preferably about 50 $\mu$m or less. The fine grain size aids in achieving a uniform film thickness during deposition, allows the target to sputter faster, and seems to result in fewer particle problems on the substrate, i.e. wafer. It is also important in accordance with the invention for the target to be diffusion bonded to a light weight, high strength backing plate. As targets become larger, particularly those designed for 300 mm diameter silicon wafers, the weight of the target becomes a significant handling factor. Technically, it would be possible to decrease the thickness of the sputtering target surface because only a part of the target is consumed. However, in order to take advantage of this capability, it is necessary to bond a thinner target blank onto a lightweight backing plate provided the thinness of the sputtering target surface does not allow the target assembly to warp during use. Warping of the target can lead to inconsistent deposition as well as particle generation. Therefore, it is important that the backing plate be strong and stiff in addition to being lightweight. The present invention achieves these objectives by providing a sputtering target assembly comprising high purity copper target diffusion bonded to a precipitation hardened aluminum backing plate. By use or diffusion bonding to join the target to the backing plate it is possible to avoid the need for soldering which is undesirable because temperatures required for sputtering often are sufficiently high to melt the solder bond of the targets and, moreover, the heat generated has potential to continue grain growth in the target after long periods of use.

SUMMARY OF THE INVENTION

In accordance with the invention there is provided a sputtering target assembly comprising a high purity copper target, a precipitation hardened aluminum alloy backing plate and an intermediate layer of CuCr diffusion bonded to the target and backing plate. Desirably, the aluminum is in the fully hard T6 condition and the sputtering target comprises copper of a purity of at least about 99.999 wt. %. The sputtering target also contains a micro-alloy grain stabilizers comprising at least one of Ag, Sn, Te, In, Mg, B, Bi, Sb, and P. The stabilizer is preferably present in an amount of about 0.3 ppm to 10 pmm. The intermediate CuCr comprises copper and about 0.5 to 1.5 wt. % Cr, preferably about 1%. The high purity copper target has a substantially uniform grain size of not more than about 50 $\mu$m.

In another embodiment of the invention there is provided a method of making a sputtering target assembly which comprises providing high purity copper target of at least about 99.999 wt. % purity. Preparing a master alloy of copper and not more than about 10 ppm of at least one of the micro-alloy grain stabilizers described previously, preparing molten combination of high purity copper and the master alloy and solidifying the molten combination to produce a cast billet; hot deforming the cast billet for a total of at least about 50% deformation on each of the axes and then rapidly quenching the deformed billet, preferably in water; frictionless forging the quenched billet at elevated temperature to about 70% of the starting length of the billet and rapidly quenching preferably in water; cold rolling to a total of about 90% deformation; producing an aluminum alloy backing plate having a precladding surface of CuCr diffusion bonded thereto; diffusion bonding the high purity copper target to the preclad CuCr surface; and precipitation hardening the aluminum alloy backing plate to the fully hard T6 condition.

Preferably the master alloy is prepared by combining a major amount of high purity copper with a minor amount of at least one of the micro-alloy stabilizers Ag, Sn, Te, In, Mg, B, Bi, Sb, and P, melting the combination and casting to produce a master alloy. In the preferred embodiment the master alloy is formed by combining high purity copper with at least one of the micro alloy stabilizers in a ratio of about 1,000 to 1.

The backing plate having a precladding surface of CuCr diffusion bonded thereto is preferably produced by a process comprising embedding an alloy of Cu and Cr in an aluminum or aluminum alloy envelope and e-beam welding the envelope closed in a vacuum environment; heat treating the enclosed envelope and forging to bring the CuCr into intimate contact with the aluminum alloy, and then heat treating to diffusion anneal and solutionize the hardening elements in the aluminum alloy, quenching and thereafter removing the aluminum alloy envelope to expose the CuCr surface and precipitation harden the aluminum alloy to a fully hard T6 condition.

Sputtering targets in accordance with the invention may be used to produce an interconnect for use in an integrated circuit, having a width 0.18 microns or less and comprising copper of at least about 99.999 wt. % purity, preferably copper of at least about 99.9999 wt. % purity.

BRIEF DESCRIPTION OF THE DRAWINGS

FIG. 6 is a photomicrograph of a sample having been subjected to a 40% deformation;

FIG. 7 is a photomicrograph of a sample having been subjected to a 30% deformation;

DETAILED DESCRIPTION

Figure 1:
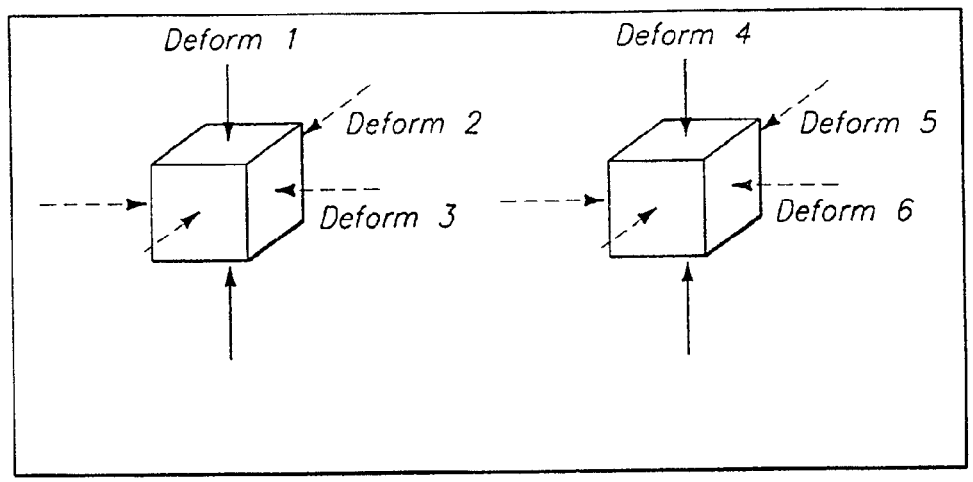
FIG. 1 is a schematic diagram showing the orientation of the deformation steps in the hot work breakdown of the cast copper billet.

As previously discussed, high purity copper, for example of at least 99.999 wt. % purity is especially useful for producing high purity copper interconnects for use in integrated circuits. Control of grain size and grain growth is very difficult for purity levels exceeding 99.999 wt. % and containing unalloyed material. Also, copper is particularly susceptible to anomalous grain growth effects, where a few grains scattered throughout the material grow considerably faster than the matrix. As the grains grow, they consume the smaller matrix grains until the entire structure ends up with a very large grain size, often in excess of 250 $\mu$m. There is a critical temperature for the onset of anomalous grain growth but unfortunately the critical temperature is often above the minimum temperature needed for diffusion bonding.

It might be desirable to employ low diffusion bonding temperatures so as not to de-stabilize the target grain structure, but high purity copper does not possess the inherent temperature stability to survive these conditions and if used, result in a weak bond strength, i.e. less than 4,000 psi. Also, the use of a low temperature bonding techniques does nothing to stabilize the target microstructure during heat generated during the sputtering process.

It has been found that through use of selected alloying elements at ppm and sub-ppm levels, a high purity copper target microstructure can be stabilized sufficiently to allow diffusion bonding and prevent grain growth under high power sputtering conditions that generate a considerable amount of heat. However, controllably alloying to the ppm and sub-ppm levels is difficult. The present invention solves this problem by use of a master alloy with precise control of the amounts of micro-alloying stabilizers. The amounts of alloying elements are at sufficiently low levels as to not interfere with the bulk resistivity of the copper. The stabilization of the structure provides some latitude in temperature parameters during diffusion bonding processes thereby permitting enough of a temperature window to provide a mechanically strong bond, e.g. greater than bout 4,000 psi, with a high stiffness backing plate.

The thermal mechanical processing used to make the targets has a major affect on the final grain size and uniformity. The deformation process must be able to break up existing grains regardless of their size and orientation. Large deformation on all three axis of the casting billet is required. An incorrect deformation process yielding insufficient deformation will result in some of the as cast grain structure being retained in the final structure as larger grains that are partially or fully re-crystallized. Such large-grained areas can interfere with the sputtering performance of the target. Correct deformation procedures will result in a fine grain and substantially uniform structure in the target.

To produce a sputtering target assembly in accordance with the invention a high purity copper target is diffusion bonded to a precipitation hardened aluminum alloy backing plate by use of an intermediate CuCr interlayer between the high purity copper target and the aluminum backing plate. This provides a final bonded target assembly with several unique properties. Firstly, the grain size of the high purity copper target remains small, e.g. less than about 50 $\mu$m and substantially uniform, i.e. with no anomalous grain growth. Secondly, the strength of the precipitation hardened backing plate is in the fully hard T6 condition, which is an important requirement for large, thin planar sputtering targets. This technique could be used with precipitation hardenable Al alloys, such as the 2000, 6000 or 7000 series alloys. It is also possible to achieve diffusion to a non-precipitation hardenable alloy, such as the 5000 series alloy, but the backing plate will not achieve a fully hard condition, with alloy 6061 being the most popular grade.

In addition to the CuCr alloy described, there are a number of commercial Cu alloys that could be used in this process.

These alloys are included in the following:

TABLE 1

| *UNS # | Copper/Copper Alloy Types |
|---|---|
| C10100 | Oxygen-free coppers |
| C10200 | |
| C10300 | |
| C10400 | Oxygen-free silver coppers |
| C10500 | |
| C50700 | |
| C10800 | Oxygen-free low phosphorus copper |
| C11000 | Electrolytic tough pitch coppers |
| C11300 | Silver bearing, tough pitch coppers |
| C11400 | |
| C11500 | |
| C11600 | |
| C12500 | Fine refined, tough pitch coppers with silver |
| C12700 | |
| C12800 | |
| C12900 | |
| C13000 | |
| C14300 | Cadmium coppers |
| C14310 | |
| C16200 | |
| C14500 | Free machining coppers |
| C18700 | |
| C14700 | Sulfur copper |
| C15000 | Zirconium copper |
| C17000 | Beryllium coppers |
| C17200 | |
| C17300 | |
| C17500 | |
| C17600 | |
| C18200 | Chromium coppers |
| C18400 | |
| C18500 | |
| C19200 | High strength modified coppers |
| C19400 | |
| C19500 | |

TABLE 1-continued

| *UNS # | Copper/Copper Alloy Types |
|---|---|
| C60600 | Aluminum bronze |
| C65100 | Low silicon bronze |

*The Unified Numbering System (UNS) is the accepted alloy designation system in North America for wrought and cast copper alloy products. The three-digit system developed by the U.S. copper and brass industry was expanded to five digits following the prefix letter C and made part of the Unified Numbering System for Metals and Alloys. UNS designations are simply expansions of the former designations. For example, Copper Alloy No. 377 (forging brass) in the original three-digit system became C37700 in the UNS System. The UNS is managed jointly by the American Society for Testing and Materials and the Society of Automotive Engineers. Because these old numbers are embedded in the new UNS numbers, no confusion need result.

In one example of the method of producing a high purity sputtering target assembly in accordance with the invention, a high purity copper target of at least about 99.999 wt. % purity, preferably at least about 99.9999 wt. % purity, is provided. A high purity Cu target can be made by a casting process that includes consolidation of ultra-high purity, electro-refined copper cathode plate. The cathode plate is melted in order to allow residual chemicals from the refining process to be burned off. Surface moisture from the environment is also driven off during melting, and the melt is held at a high enough temperature to allow a majority of the gases and volatilizable material entrapped in the metal, such as oxygen and sulfur, to be driven from the metal. The metal is then allowed to solidify in the crucible.

An important step in the copper casting process is to prepare a master alloy. Although there many alloying elements have the ability to raise the recrystallization temperature of pure copper, the required alloying level has been thought to be typically higher than 1000 ppm. However, in accordance with the present invention it has been found that significant increases in the recrystallization temperature can be achieved with lesser amounts of selected alloying elements, i.e. less than about 10 ppm, or even sub-ppm level additions, but the potential alloying elements must be chosen so as not to interfere with the resistivity of the metal. Alloying elements that meet this criteria include, but are not limited to, Ag, Sn, Te, In, Mg, B, Bi, Sb, and P. As an example, silver may be added in the range of about 0.3 ppm to 10 ppm to act as a stabilizer for the grain structure during diffusion bonding, while still allowing the Cu target to meet the minimum 99.999 wt. % purity grade specifications. A preferred amount of silver is about 2.5 ppm in this context. However, to make the master alloy with silver, or any of the other micro-alloy elements, care must be taken to avoid simply adding the pure form of the element to copper since this will result in a loss of significant amounts of the element due to the fact that their vapor pressure may exceed 1 atmosphere at the temperatures typically used for melting copper. Because the vapor pressure is high, the alloying addition, e.g. silver, would evaporate, making it difficult to control the ppm or sub-ppm level of the alloying additions. To precisely control the alloying level, a master alloy, e.g. with at least 100 ppm silver, is used. To make this master alloy a ratio of copper to alloying addition of about 1,000 to 1 is desirable. For example, 2000 grams of high purity copper cathode plate is melted with 2 grams of silver. The metal may be melted via induction heating in an open atmosphere. Once the metal becomes molten, the melt is cast into one-inch diameter billets. A sample of the billet is cut and analyzed by the GDMS (Glow discharge mass spectrometer) analysis method. The small diameter billet of the master alloy can then be easily cut into convenient sizes for adding as alloying addition.

After the master alloy has been made, it can be combined in appropriate amounts with pure high purity copper to be melted to form a cast billet. This operation is advantageously conducted in a vacuum furnace in order to minimize the possibility of oxidation. The pre-consolidated cathode plate is weighed to provide an amount which will produce the desired billet size, then the master alloy is cut and weighed to the desired alloying level, e.g. 2.5 ppm silver. The pre-consolidated copper and master alloy is then placed in a melting crucible in a vacuum chamber. In the preferred embodiment the material will be heated until it reaches about 1200° C. to melt at which temperature it is held for about ten minutes and then cooled to about 1038° C. The cycle is repeated two additional times to drive off any residual gas in the metal under vacuum environment. The metal is then heated to the casting temperature and poured into a graphite mold and cooled. The top 3 inches and bottom 2 inches may be cut from the cast billet to remove any shrinkage or solidification voids at the top of the billet and cold laps at the bottom of the billet. The billet is then ready for deformation.

The billet is deformed to remove the as-cast grain structure. This deformation step is referred to as the "hot work breakdown" of the billet.

Again in the preferred embodiment the billet is processed as follows: The billet is first heated to about 343° C. and then deformed for a total of 50% deformation on each of the 3 axes. FIG. 1 shows the orientation of the deformation steps and the hot work deformation schedule. The billet is water quenched after the sixth hot work breakdown step.

The next step is frictionless forging. The billet is heated to about 343° C. and forged in a friction free condition to 70% of the starting height using the same axis as the first hot work breakdown deformation step. The sample is then water quenched. Next, the material is cold rolled to give a total of 90% deformation (frictionless forge+cold roll). The material is then ready for diffusion bonding.

Figure 2:
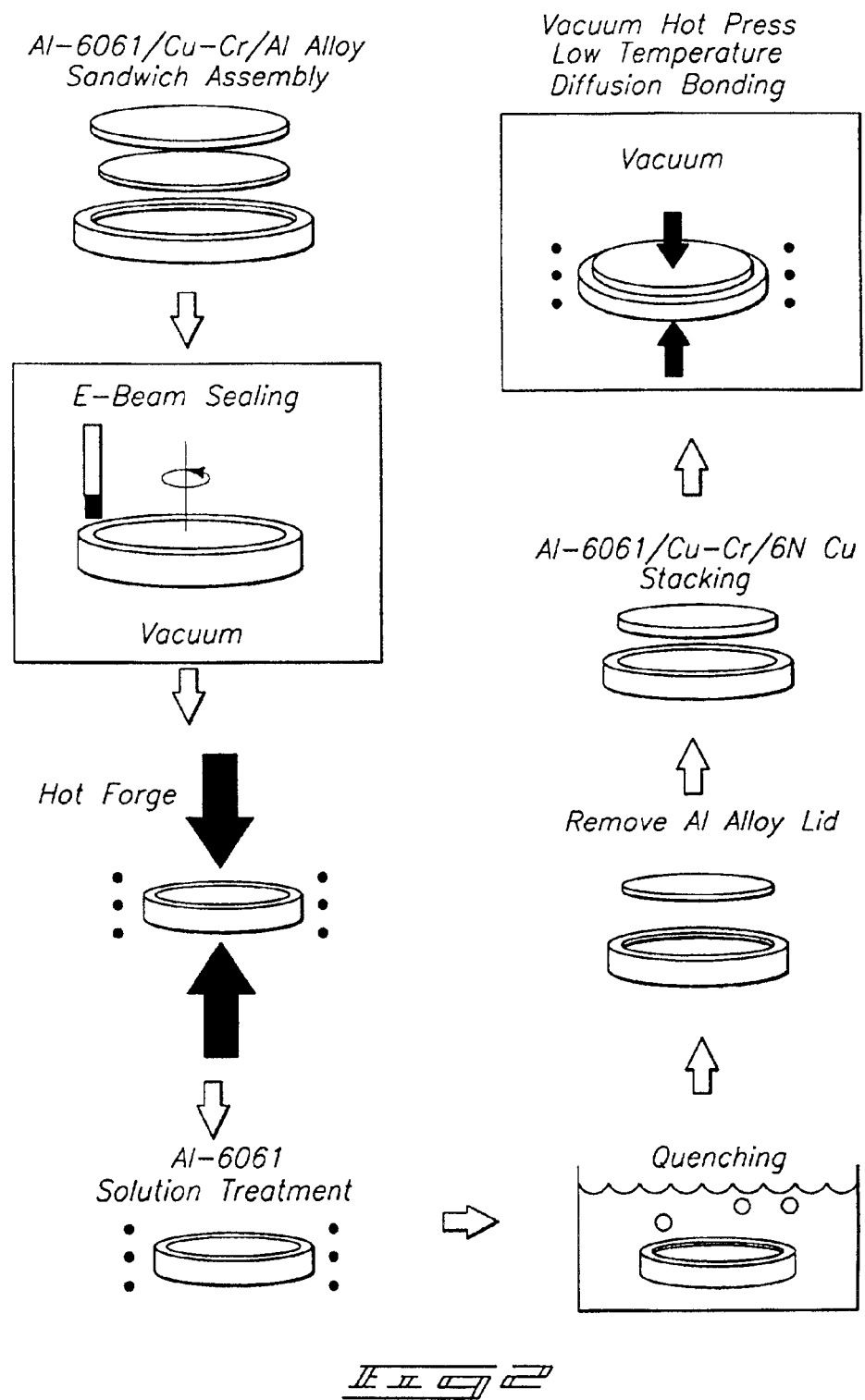
FIG. 2 is a schematic flow diagram for diffusion bonding of a high purity copper target.

The process for diffusion bonding process is shown generally in FIG. 2.

The first step in the diffusion bonding process involves the simultaneous diffusion bonding of the CuCr to the precipitation hardenable aluminum alloy and the solutionizing of the aluminum alloy. A thin alloy plate of copper with about 0.5 to 1.5 wt. % chromium is first embedded inside an envelope of aluminum alloy as shown in FIG. 2. This assembly is then e-beam welded shut in a vacuum environment. The sealed assembly can be removed from the vacuum environment and handled freely without fear of contamination or oxidation. The assembly is heated to 338° C., and the temperature is allowed to equilibrate for 30 minutes.

After 30 minutes at 338° C., the assembly is forged at 300° C. to bring the CuCr and the aluminum alloy 6061 into intimate contact. The assembly is then quickly returned to the furnace for a 1-hour diffusion anneal at 338° C. After 1 hour at 338° C., the furnace temperature is then slowly ramped to 529° C. and held at this temperature for 90 minutes to put all the hardening elements in the 6061 alloy into solution. This solutionizing step is followed immediately by a rapid quench, e.g. in water. Quenching is critical in order to retain the hardening elements in solution for subsequent precipitation hardening. Quenching differentiates this process from HIP or vacuum hot press processes, since quenching would not be possible in the latter two cases. After quenching, the cover of the assembly is machined off to expose the CuCr surface.

The pre-clad backing plate is now ready for diffusion bonding to the Cu sputtering target blank. A cleaned Cu blank is stacked on the cleaned CuCr surface, and the stack is placed into a vacuum hot press where it is hot pressed under 8,500 psi of pressure at about 250° C. and 300° C. for 2 hours, and furnace cooled to room temperature. Several critical transformations in the target fabrication process occur during this step. First the Cu blank is recrystallized to form a fine grained, uniform and stable microstructure. Second, the diffusion bond is formed between the Cu blank and the CuCr interlayer. Finally, the 6061 aluminum alloy backing plate is precipitation hardened to the fully hard T6 condition.

The thermal mechanical processing used will have an affect on the final grain size and uniformity. Incorrect deformation procedure will result in some of the as cast grain structure being retained in the final structure as larger grains that are partially or fully re-crystallized. To elucidate the difference in final metallurgy between 30% and 40% deformation during the hot work breakdown steps an experimental matrix was established. Samples were chosen to ensure that a direct comparison would be possible between the two starting samples.

Figure 3:
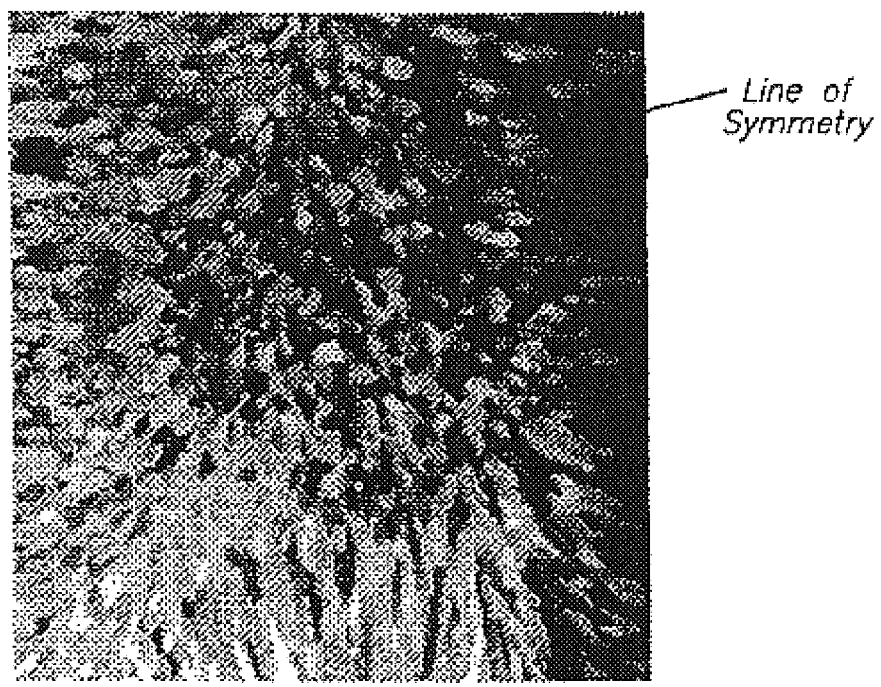
FIG. 3 is a photomicrograph of a cross section of a copper casting.
Figure 4:
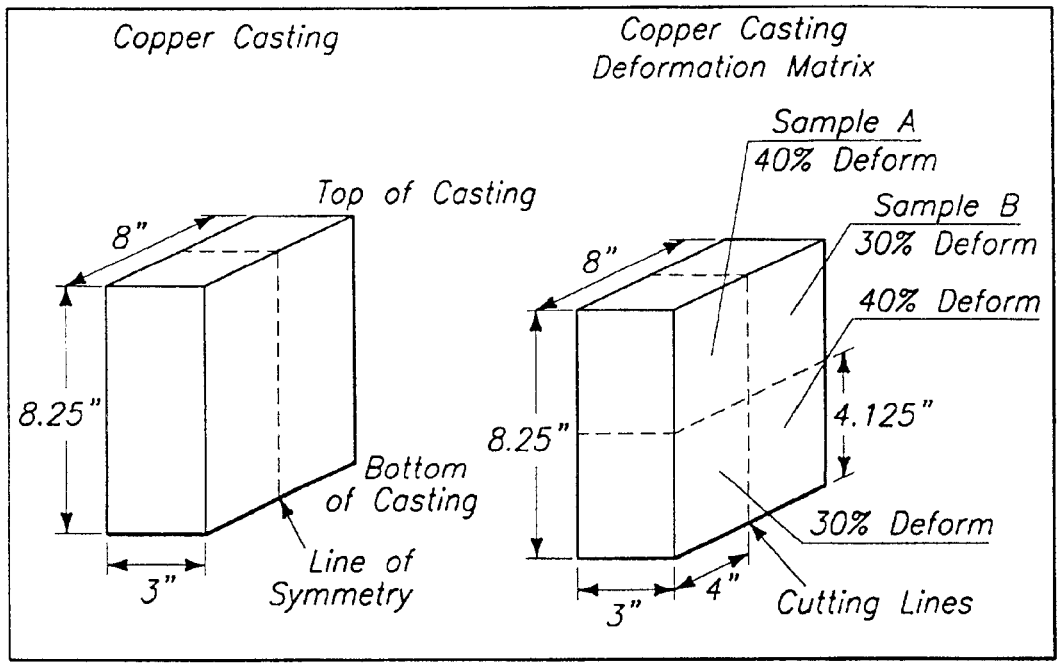
FIG. 4 is a diagram describing the sample locations on a Cu casting for an experimental matrix on deformation.
Figure 5:
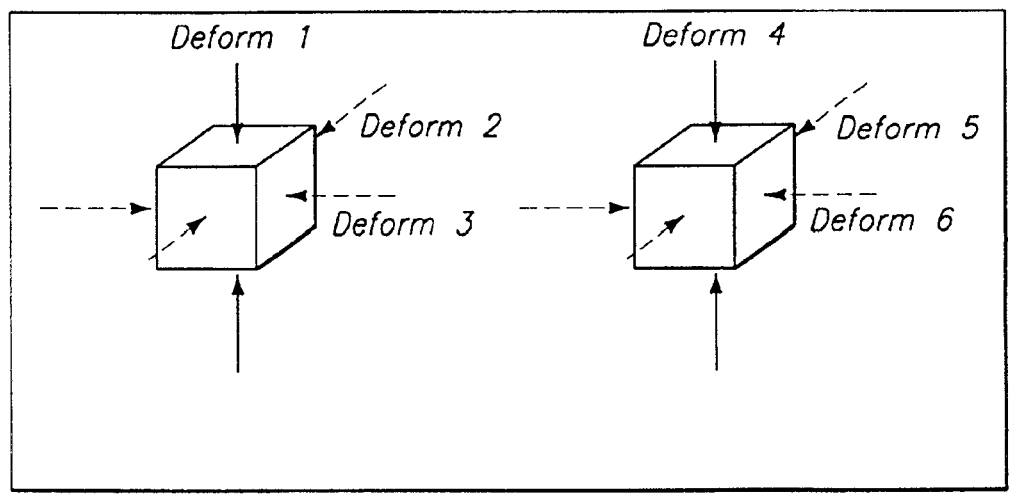
FIG. 5 is a schematic diagram describing the hot work breakdown deformation schedule.

A cast billet is symmetrical about a vertical line running down the center of the billet, see FIG. 3. Two samples cut from the top of the ingot and hot work on each axis by different amount will result in different grain sizes. As shown in FIG. 4, Sample A and B are from a region of the casting were equiaxed largest grains are present. Sample A is hot worked to get 40% deformation on each axis; Sample B is hot worked by 30% on each axis. The hot work breakdown schedule is described in FIG. 5.

Samples, polished and etched, reveal that the microstructure of the 40% deformed sample was small grained and uniform. The 30% deformed sample has a non uniform grain structure, see FIGS. 6 and 7, and FIGS. 8 and 9.

Figure 8:
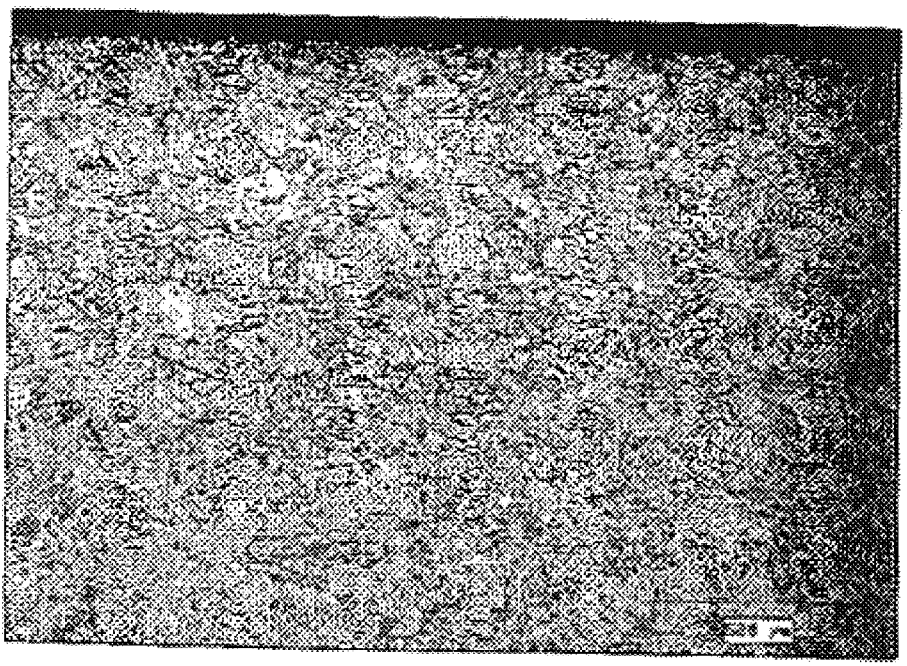
FIG. 8 is a photomicrograph of a sample subjected to a 40% deformation, as shown in FIG. 6, and 70% frictionless forging
Figure 9:
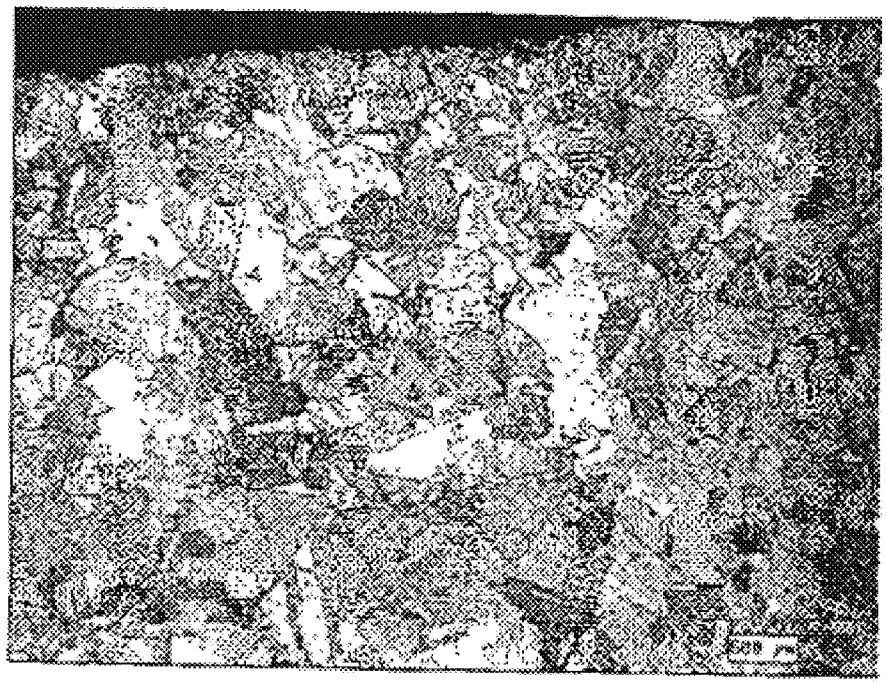
FIG. 9 is a photomicrograph of a sample subjected to 30% deformation, as shown in FIG. 7 and a 70% frictionless forging.
Figure 10:
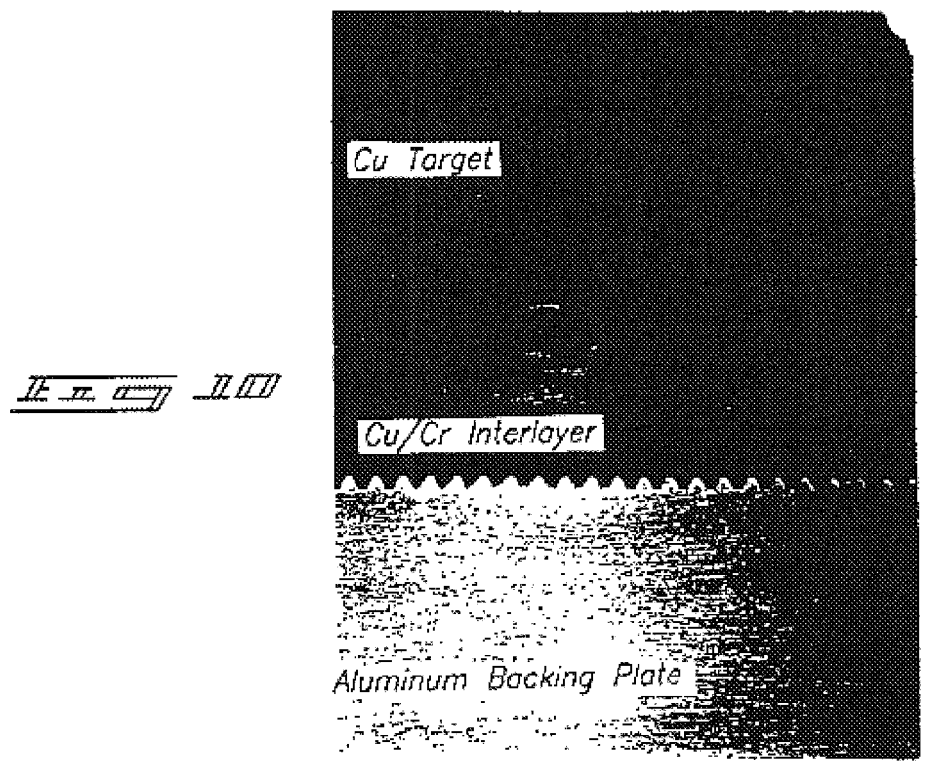
FIG. 10 is a photomicrograph of a Cu target, CuCr intermediate layer and an Al backing plate.
Figure 11:
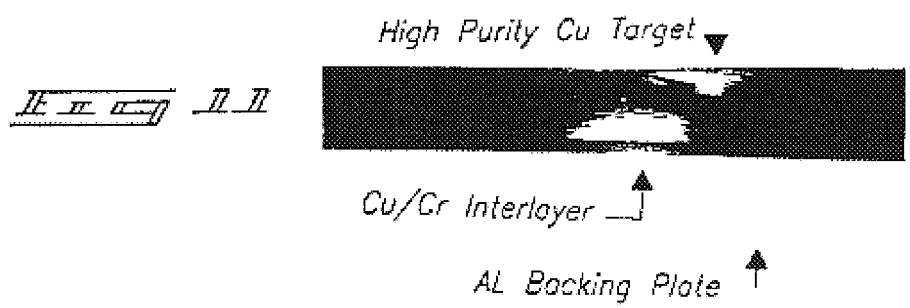
FIG. 11 is a photomicrograph of a Cu target, CuCr intermediate layer and an Al backing plate.
Figure 12:
FIG. 12 is a photomicrograph of a Cu target microstructure at 200×magnification, showing grain size of about 30 $\mu$m.

As can be seen, the hot work samples that are rolled or forged in one direction will have a grain structure and size that is dependent on the as hot-worked grains. Microstructures of Samples A and B frictionless forged 70% in one direction as shown in FIGS. 6 and 7 are in the polished and etched state. The amount of deformation done during the hot work breakdown has an effect on final grain size, as indicated in the photomicrographs of FIGS. 8 and 9. Clearly, the grain size of FIG. 8 is significantly finer. FIGS. 10 and 11 show the assembly of a Cu target Al backing plate and intermediate CuCr interlayer. FIG. 12 shows the fine grain size of the high purity Cu target.

Recommended alloying elements include Ag, Sn, Te, In, Mg, B, Bi, Sb, and P. Silver is preferred to minimize the bulk resistivity of the material while maximizing the grain stabilization effect. Concentration range of the alloying elements are to a certain degree defined by grade. Recommended minimum and maximum concentrations are listed in Table 1. Below the minimum alloying levels, the grain structure fails to stabilize and anomalous grain growth can occur if the target is exposed to diffusion bonding temperatures. Above the maximum alloying levels, the material will no longer meet grade requirements for purity, if the microalloying element is considered in the total metallic impurities.

TABLE 2

Recommended Alloying Ranges in ppm by Weight

| Grade | Minimum Alloying Level | Maximum Alloying Level |
|---|---|---|
| 5N (99.999% pure) | 0.3 ppm | 10 ppm |
| 5N5 (99.9995% pure) | 0.3 ppm | 5 ppm |
| 6N (99.9999% pure) | 0.3 ppm | 1 ppm |

The optimum ranges for deformation are generally defined by the amount of deformation required to achieve a uniform structure. For the hot work breakdown step of the Cu deformation process, the total strain after forging should advantageously be in the range of 2.14 and 5.49, corresponding to a 30% and a 60% forged height reduction per billet face. Below the minimum strain value, the structure may be insufficiently worked and the uniform grain structure may not be able to be achieved. There is risk that anomalous grains may result in the material due to insufficient deformation of isolated large grains that happen to be unfavorably oriented for slip during forging. Above the maximum strain value, buckling may occur. Material that is folded during buckling will produce a highly non-uniform structure and will form large voids within the material. Optimum deformation for the process employs a total strain of about 4.15, with an average of about 50% forged reduction per face.

TABLE 3

Optimum Compositions For Alloying With Ag:

| Grade | Optimum Alloying Level |
|---|---|
| 5N (99.9995% pure) | 5 +/− 0.5 ppm |
| 5N5 (99.9995% pure) | 2.5 +/− 0.25 ppm |
| 6N (99.9999% pure) | 0.5 +/− 0.1 ppm |

Total cold deformation after hot work breakdown, whether done by forging, rolling, an alternative deformation method, or some combination of various cold deformation techniques, should result in a total height reduction in the range of about 84% and 93%, with the optimum being about 90%. Below this range, sufficient grain refining may not occur and the final product grain size may be too large. Above this range, the excess strain causes the recrystallization temperature and anomalous grain growth onset temperature to drop below the diffusion bond temperature.

It is apparent from the foregoing that various changes and modification may be made without departing from the invention. Accordingly, the scope of the invention should be measured only by the appended claims wherein what is claimed is.

What is claimed is:

1. A method of making a sputtering target assembly comprising:

providing high purity copper target of at least about 99.999 wt. % purity;

preparing a master alloy comprising copper and not more than about 10 ppm of at least one of Ag, Sn, Te, In, Mg, B, Bi, Sb, and P;

preparing a cast billet by forming a molten combination of copper and master alloy and solidifying the molten combination;

deforming the cast billet for a total of at least about 50% deformation on each axis and then rapidly quenching the deformed billet;

frictionless forging the quenched billet at elevated temperature to about 70% of the starting length of the billet, and rapidly quenching;
cold rolling to a total of about 90% deformation;
providing an aluminum alloy backing plate having a preclad CuCr surface; and precipitation hardening the aluminum alloy backing plate.

2. A method according to claim 1 wherein the preparing said master alloy comprises:
forming a combination by combining the high purity copper with the at least one of Ag, Sn, Ti, In, Mg, B, Bi, Sb, and P;
melting the combination; and
casting the combination.

3. A method according to claim 2 wherein the high purity copper is combined with the at least one of Ag, Sn, Ti, In, Mg, B, Bi, Sb, and P in a ratio of about 1000 to 1.

4. A method according to claim 1 further comprising:
forming the aluminum alloy backing plate wherein the forming comprises:
embedding an alloy of Cu and Cr in an aluminum or aluminum alloy
envelope;
welding the envelope closed in a vacuum environment;
heat treating the enclosed envelope;
forging, wherein the forging brings the CuCr into intimate contact with the
aluminum alloy to be used as a backing plate;
quenching;
removing the aluminum alloy envelope to expose the CuCr surface; and
precipitation hardening the aluminum alloy.

5. A method of forming a sputtering target comprising:
forming a master alloy comprising:
a first high purity copper material; and
a micro-alloy grain stabilizer comprising dispersed within the first high purity copper material;
adding an amount of the master alloy to a second high purity copper material to form a sputtering target composition having a desired concentration of the micro-alloy grain stabilizer dispersed within copper; and
shaping the sputtering target composition into a target configuration.

6. The method of claim 5 wherein the forming the master alloy comprises combining the first high purity copper material with the micro-alloy grain stabilizer In a ratio of at least about 1000 parts copper to 1 part of the micro-alloy grain stabilizer.

7. The method of claim 5 wherein the first and second high purity copper materials have a purifies of at least about 99.999 wt. %.

8. The method of claim 5 wherein the first and second high purity copper materials have a purities of at least about 99.9995 wt. %.

9. The method of claim 5 wherein the micro-alloy grain stabilizer consists essentially of silver.

10. The method of claim 5 wherein the a micro-alloy grain stabilizer additionally comprises one or more of Sn, To, In, Mg, B, Bi, Sb, and P dispersed within the first high purity copper material.

* * * * *

UNITED STATES PATENT AND TRADEMARK OFFICE
CERTIFICATE OF CORRECTION

PATENT NO. : 6,849,139 B2
DATED : February 1, 2005
INVENTOR(S) : Kardokus et al.

It is certified that error appears in the above-identified patent and that said Letters Patent is hereby corrected as shown below:

Column 1,
Line 57, replace "or" with -- of --.

Column 2,
Line 9, replace "10 pmm" with -- 10 ppm --.

Column 3,
Line 19, replace "200xmagnification" with -- 200 x magnification --.
Line 61, replace "bout" with -- about --.
Line 67, replace "axis" with -- axes --.

Column 10,
Line 4, after "comprising" insert -- Ag --.
Line 15, replace "In" with -- in --.
Line 20, replace "purifies" with -- purity --.
Line 23, replace "purities" with -- purity --.
Line 27, replace "a micro-alloy" with -- micro-alloy --.
Line 28, replace "To" with -- Te --.

Signed and Sealed this

Twenty-second Day of November, 2005

JON W. DUDAS
*Director of the United States Patent and Trademark Office*